US012615747B2

(12) United States Patent
Fan et al.

(10) Patent No.: US 12,615,747 B2
(45) Date of Patent: Apr. 28, 2026

(54) ELECTRONIC-CELL ASSEMBLIES INCLUDING SINGLE-LAYER GRAPHITE LAYER

(71) Applicant: Toyota Motor Engineering & Manufacturing North America, Inc., Plano, TX (US)

(72) Inventors: Tianzhu Fan, Houston, TX (US); Feng Zhou, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 197 days.

(21) Appl. No.: 18/405,238

(22) Filed: Jan. 5, 2024

(65) Prior Publication Data

US 2025/0227894 A1     Jul. 10, 2025

(51) Int. Cl.
*H05K 7/20* (2006.01)

(52) U.S. Cl.
CPC ......... *H05K 7/209* (2013.01); *H05K 7/20509* (2013.01)

(58) Field of Classification Search
None
See application file for complete search history.

(56) References Cited

U.S. PATENT DOCUMENTS

2023/0247807 A1*  8/2023  Zhou ................... H05K 7/20509
                                                              361/711
2024/0172400 A1*  5/2024  Pitts ...................... D03D 15/275
2024/0413045 A1*  12/2024  Kamiya .............. H01L 23/3735

FOREIGN PATENT DOCUMENTS

| CN | 101307893 | A | 11/2008 |
|---|---|---|---|
| DE | 212020000697 | U1 | 3/2022 |
| JP | 2011199202 | A * | 10/2011 |
| JP | 2014017412 | A * | 1/2014 |
| JP | 6873791 | B2 | 5/2021 |
| KR | 1020150101685 | A | 9/2015 |
| WO | 03052340 | A1 | 6/2003 |

OTHER PUBLICATIONS

JP 2011199202 A English translation (Year: 2011).*

(Continued)

*Primary Examiner* — Mukundbhai G Patel
(74) *Attorney, Agent, or Firm* — Dinsmore & Shohl LLP

(57)     ABSTRACT

Embodiments are directed to an electronic-cell assembly. The electronic-cell assembly includes an heat spreader and a power electronics device. The heat spreader includes a metal layer and a single-layer graphite layer. The metal layer encases the single-layer graphite layer and defines a power device recess in an outer surface of the metal layer. The single-layer graphite layer includes three or more adjacent graphite pieces having high thermal conductivity along a thickness direction. The power electronics device is disposed within the power device recess of the outer surface of the heat spreader. At least one of the graphite pieces has low thermal conductivity along a first axis and the high thermal conductivity along a second axis. The first axis and the second axis are perpendicular to the thickness direction. At least one of the graphite pieces has the high thermal conductivity along the first axis and the low thermal conductivity along the second axis.

18 Claims, 6 Drawing Sheets

(56) References Cited

OTHER PUBLICATIONS

JP 2014017412 A English translation (Year: 2014).*
Xu, Bin et al., "Ultra-high-performance heat spreader based on a graphite architecture with three-dimensional thermal routing," Journal Article, Oct. 2021, Cell Reports Physical Science, vol. 2, No. 11, https://doi.org/10.1016/j.xcrp.2021.100621.

* cited by examiner

319

339

ELECTRONIC-CELL ASSEMBLIES INCLUDING SINGLE-LAYER GRAPHITE LAYER

TECHNICAL FIELD

The present specification generally relates to power electronic assemblies and, more specifically, apparatuses and methods for power electronic assemblies having low overall thermal resistance while achieving a compact package size.

BACKGROUND

Due to the increased use of electronics in vehicles, there is a need to make electronic systems more compact. One component of these electronic systems is a power electronic device used as a switch. Power electronic devices have large cooling requirements due to the heat generated.

Additionally, there has been a trend for power electronic devices conventionally composed of silicon to now be composed of silicon-carbide. The use of silicon carbide causes a larger heat flux due to it defining a smaller device footprint. Moreover, heat spreader assemblies include one or more graphite layers to facilitate heat spreading. However, such graphite layers do not provide uniform heat-spreading capabilities along each axis.

For these reasons, and more, there is a need to improve the cooling of power electronic devices while maintaining a compact package size.

SUMMARY

In one embodiment, an heat spreader includes a metal layer and a single-layer graphite layer. The metal layer encases the single-layer graphite layer. The single-layer graphite layer includes three or more adjacent graphite pieces having high thermal conductivity along a thickness direction. At least one of the graphite pieces has low thermal conductivity along a first axis and the high thermal conductivity along a second axis. The first axis and the second axis are perpendicular to the thickness direction. At least one of the graphite pieces has the high thermal conductivity along the first axis and the low thermal conductivity along the second axis.

In another embodiment, an electronic-cell assembly includes an heat spreader and a power electronics device. The heat spreader includes a metal layer and a single-layer graphite layer. The metal layer encases the single-layer graphite layer and defines a power device recess in an outer surface of the metal layer. The single-layer graphite layer includes three or more adjacent graphite pieces having high thermal conductivity along a thickness direction. The power electronics device is disposed within the power device recess of the outer surface of the heat spreader. At least one of the graphite pieces has low thermal conductivity along a first axis and the high thermal conductivity along a second axis. The first axis and the second axis are perpendicular to the thickness direction. At least one of the graphite pieces has the high thermal conductivity along the first axis and the low thermal conductivity along the second axis.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
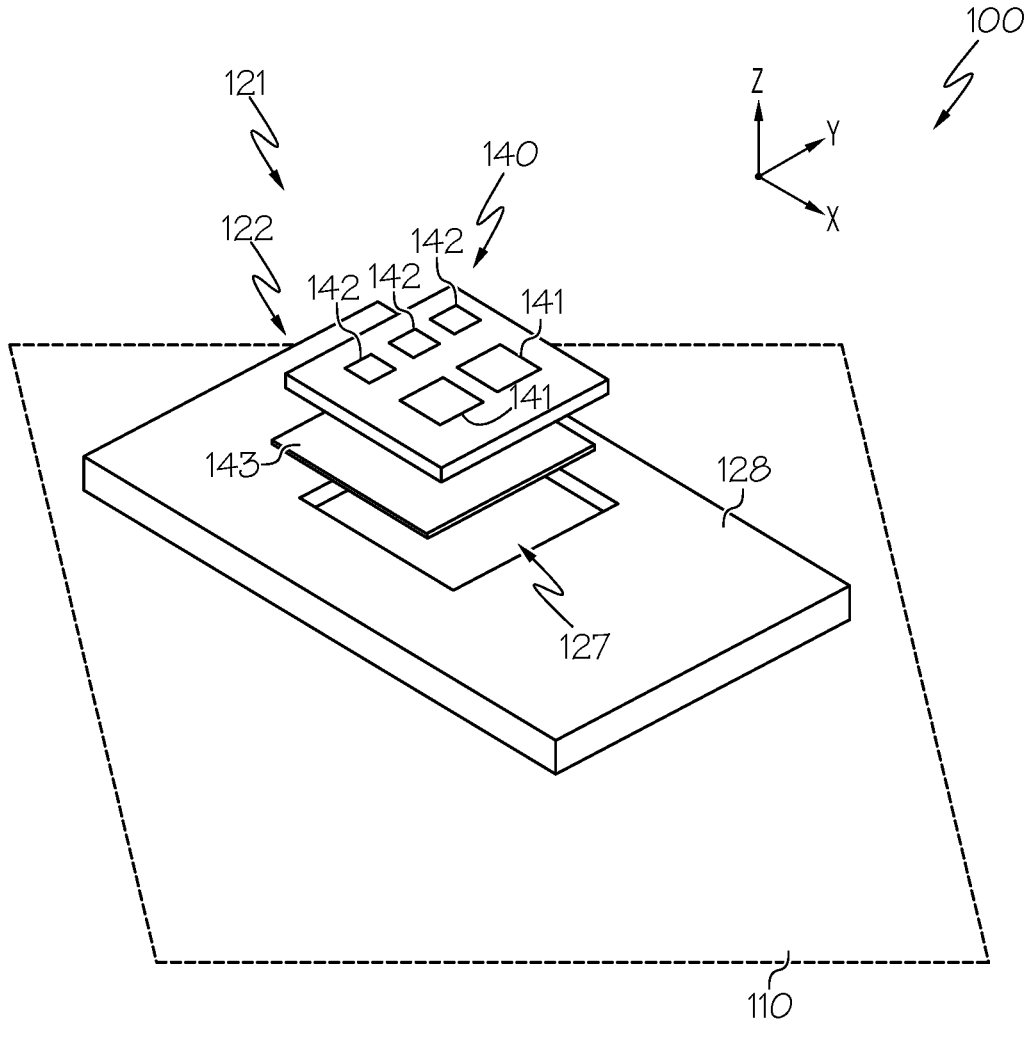
FIG. 1 schematically depicts an exploded perspective view of an electronic-cell assembly, according to one or more embodiments described and illustrated herein.

Embodiments described herein are generally directed to heat spreaders and heat spreader assemblies. A power electronics device may be embedded within a recess formed within an heat spreader of each electronic-cell assembly. The heat spreader assemblies of the present disclosure include a power electronics device affixed to a mounting substrate referred to herein as an heat spreader. As described in more detail below, the heat spreader includes a single-layer graphite layer that provides enhanced heat-spreading capabilities.

Throughout the disclosure, a center portion of an object refers to the middle part or central region of the object. An upper portion of an object refers to the top section of the object. The lower portion of an object refers to the bottom part of the lower region of the object. The object may have a rectangular shape, a square shape, a trapezoid shape, a triangular shape, a bow-tie shape, a U shape, or a V shape.

As described in more detail below, the heat spreaders of the present disclosure provide enhanced thermal properties due to graphite layers that promote heat flux flow toward a cooling device, such as a heat sink or a cold plate. The heat spreaders described herein include stacked metal and a single-layer graphite layer in a compact package. The crystalline structure of graphite provides the graphite with high thermal conductivity, making it useful to conduct heat flux toward the cooling device. However, graphite does not have an isothermal profile. Rather, graphite has an anisothermal profile with high conductivity along two axes and low thermal conductivity in a third axis. To account for the anisothermal profile of graphite, the disclosed single-layer graphite layer has three or more adjacent graphite pieces having high thermal conductivity along a thickness direction to balance heat spreading capabilities across three axes of the graphite layers. Particularly, each graphite piece has a high thermal conductivity across two axes that differs from the two axes of another adjacent graphite piece to provide a balanced thermal conductivity along each of the three axes of the single-layer graphite layer. The disclosed single-layer graphite layer includes customizable graphite pieces in terms of sizes and configurations to optimize heat transfer based on the heat source's location and contact size, and the single-layer graphite layer's shape. This enables robust control and flexibility in designing electronic cell assembly. The heat spreaders may include bonding materials. The bonding materials described herein for bonding the heat spreaders are particularly adapted for increased thermal conductivity relative to other bonding technologies, while also maintaining an ability to electrically insulate the heat spreaders. The devices, systems, and apparatuses described herein improve the heat flux from the heat spreader to the cooling device, thereby increasing heat spreading and cooling performance for the circuit board assembly.

The heat spreader assemblies, circuit board assemblies, power electronics assemblies, and the like described herein may be used in electrified vehicles, such as and without being limited to, an electric vehicle, a hybrid electric vehicle, a plug-in hybrid electric vehicle, electrified mobility, any electric motor, generators, industrial tools, household appliances, and the like. The various assemblies described herein may be electrically coupled to an electric motor and/or a battery and may be configured as an inverter circuit operable to convert direct current (DC) electrical power to alternating current (AC) electrical power.

As used herein, a "power electronics device" means any electrical component used to convert DC electrical power to AC electrical power and vice-versa. Embodiments may also be employed in AC-AC converter and DC-DC converter applications. Non-limiting examples of power electronics devices include power metal-oxide-semiconductor field effect transistors (MOSFET), insulated-gate bipolar transistors (IGBT), thyristors, and power transistors.

As used herein, the phrase "fully embedded" means that each surface of a component is surrounded by a substrate. For example, when an electronic-cell assembly is fully embedded by a component, it means that the material of the component covers each surface of the electric-cell assembly. A component is "partially embedded" when one or more surfaces of the component are exposed. As used herein, an "heat spreader" is a mounting substrate operable to be affixed to a power electronics device and includes one or more of a metal layer and a graphite layer, such as a single-layer graphite layer.

Various embodiments of power electronics assemblies and heat spreader assemblies are described in detail below. Whenever possible, the same reference numerals will be used throughout the drawings to refer to the same or like parts.

Figure 2:
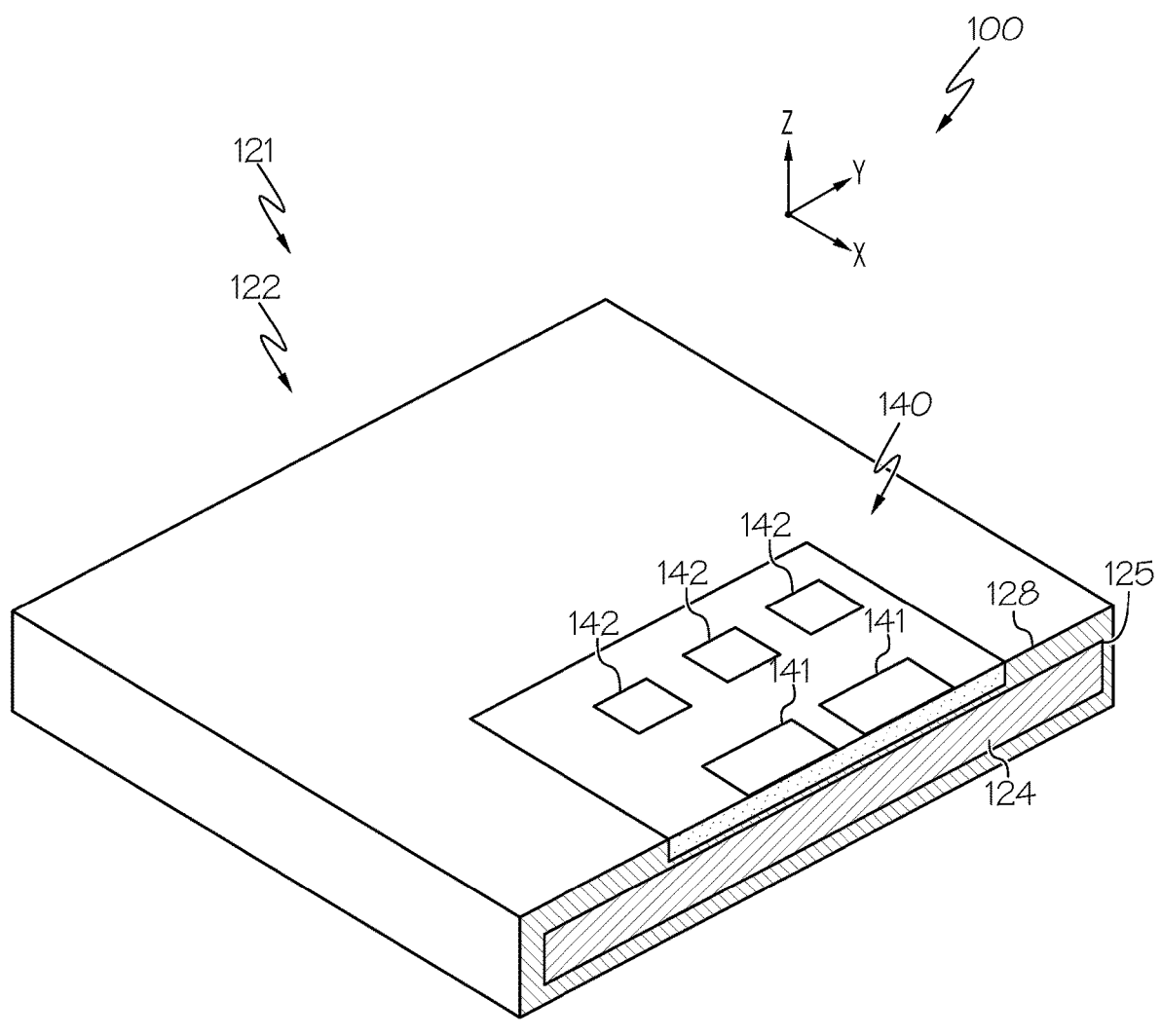
FIG. 2 schematically depicts a cross-section perspective view of the electronic-cell assembly of FIG. 1, according to one or more embodiments described and illustrated herein.

Referring now to FIGS. 1 and 2 an exploded top perspective view and an assembled cross-sectional view, respectively, of an example heat spreader 121 is shown. The heat spreader 121 includes a plurality of stacked layers. Particularly, the heat spreader 121 illustrated in FIGS. 1 and 2 include a metal layer 122, and a single-layer graphite layer 124 embedded within the metal layer 122. However, it should be appreciated that additional graphite layers may be provided. The metal layer 122 includes an inner surface 125 and an outer surface 128 opposite the inner surface 125. In embodiments, the metal layer 122 includes a first metal layer and a second metal layer with the single-layer graphite layer 124 positioned between the first metal layer and the second metal layer. In embodiments, the metal layer 122 may be a one-piece, monolithic structure rather than including a pair of metal layers. The metal layer 122 includes a recess 127 formed in the outer surface 128 of the metal layer 122. The recess 127 is dimensioned to receive a power electronics device 140. As described in more detail below, the metal layer 122 provides an electrically conductive surface to which electrodes on a bottom surface of the power electronics device 140 are connected (e.g., via a direct connection and/or via electrically connective vias). It should be appreciated that the various layers of the heat spreader 121 are depicted in FIGS. 1 and 2 are merely illustrative.

It is noted that the heat spreader 121 in the embodiment depicted in FIGS. 1 and 2 include the single-layer graphite layer 124 embedded within the metal layer 122 to provide an heat spreader 121 that is symmetrical along z-axis (i.e., the thickness direction) of the coordinate axes depicted in FIGS. 1 and 2. The symmetrical nature of the heat spreader 121 balances forces on the heat spreader 121 during the high-temperature bonding process. In some embodiments, the metal layer 122 and the single-layer graphite layer 124 may have different coefficients of thermal expansion and it may be desirable to have a symmetrical substrate stack to balance the thermally induced stresses during the bonding process.

The metal layer 122 may be made of any suitable metal or alloy. Copper and aluminum may be used as the metal layer 122 as non-limiting examples. As described herein, the metal layer 122 of the heat spreader 121 has a recess 127 formed in the outer surface 128 of the metal layer 122. The power device recess 127 may be located at a center portion, an upper portion, or a lower portion of the heat spreader 121. The recess 127 may be formed by chemical etching or machined, for example, or any other suitable process. The recess 127 has a size and shape to accept the power electronics device 140. The outer surface 128 may generally be a second major face or surface of the metal layer 122 that is opposite the inner surface 125 (which is configured as a first major face or surface of the metal layer 122). That is, the metal layer 122 may be a planar layer whereby the inner surface 125 faces the single-layer graphite layer 124 and the opposite outer surface 128 faces the power electronics device 140 and the circuit board assembly.

As depicted in FIGS. 1 and 2, the heat spreader 121 is designed to be rectangular in shape such that its length dimension is greater than its width dimension. However, as discussed herein, the shape of the heat spreader 121 is not limited to being rectangular. For example, the heat spreader 121 may be square, for example, without departing from the scope of the present disclosure.

The electronic-cell assembly 100 may promote heat flux flow toward a cooling device 110, such as, without limitations, heat sinks, single-phase liquid cooling, two-phase liquid cooling, and vapor chambers. The cooling device 110 may be any device capable of removing heat flux from power electronics devices 140 coupled to or embedded within a cavity of the cooling device 110 and/or coupled to or embedded within a substrate material of the circuit board assembly. In some embodiments, the cooling device 110 may include one or more cavities formed in the surfaces of the cooling device 110, configured to receive a plurality of heat spreader assemblies 100 for a power electronic circuit for an electric vehicle. Each electronic-cell assembly 100 may include the heat spreader 121 received within a cavity of the cooling device 110 and a power electronics device 140 coupled (e.g., affixed) to the heat spreader 121. As stated above, the heat spreader 121 is a substrate to which the power electronics device 140 is bonded. The heat spreader 121 provides an electrically conductive surface area to make connections to electrodes on the bottom surface of the power electronics device 140. As described in more detail herein, the heat spreader 121 further provides heat-spreading functionality. In some embodiments, the heat spreader 121 may also provide electrical isolation, for example, by using an electrically insulating layer interposed between the heat spreader 121 and the cavity of the cooling device 110.

In some embodiments, the heat spreader 121 may include one or more brazing layers provided between the metal layer 122 and the single-layer graphite layer 124. It should be appreciated that the one or more brazing layer are provided on opposite planar surfaces of the heat spreader 121 adjacent to the inner surface 125 of the metal layer 122 such that the one or more brazing layers faces the power electronics device 140 or/and the cooling device 110 when assembled.

In embodiments, the metal layer 122 has a first thickness extending between the inner surface 125 and the outer surface 128 equal to or greater than 0.1 mm and less than or equal to 0.5 mm. In some embodiments, the metal layer 122 has a first thickness extending between the inner surface 125 and the outer surface 128 equal to or greater than 0.001 mm, 0.002 mm, 0.005 mm, 0.01 mm, 0.25 mm, 0.50 mm, 0.75 mm, 1.00 mm, 1.25 mm, 1.50 mm, 1.75 mm, 2.00 mm, 3.00 mm, 4.00 mm, 5.00 mm, or any thickness between 0.001 mm to 5.00 mm. In some embodiments, other than the recess 127 formed in the outer surface 128 of the metal layer 122, the first thickness of the metal layer 122 is constant extending around an entire perimeter of the heat spreader 121. In embodiments, the single-layer graphite layer 124 has a second thickness equal to or greater than 0.001 mm, 0.002 mm, 0.005 mm, 0.01 mm, 0.25 mm, 0.50 mm, 0.75 mm, 1.00 mm, 1.25 mm, 1.50 mm, 1.75 mm, 2.00 mm, 3.00 mm, 4.00 mm, 5.00 mm, or any thickness between 0.001 mm to 5.00 mm.

Referring now to FIGS. 3A-3F, two example heat spreaders 121 including two types of side-center-side graphite configuration are depicted in which the single-layer graphite layer 124 is shown encased within the metal layer 122.

The single-layer graphite layer 124 includes three or more adjacent graphite pieces 311 and 313 having high thermal conductivity along a thickness direction (i.e., z-axis direction in FIGS. 1 and 2). Each graphite piece 311 or 313 has a thickness equal to the second thickness of the single-layer graphite layer 124. The thickness of the graphite pieces 311 and 313 may be equal to or greater than 0.001 mm, 0.002 mm, 0.005 mm, 0.01 mm, 0.25 mm, 0.50 mm, 0.75 mm, 1.00 mm, 1.25 mm, 1.50 mm, 1.75 mm, 2.00 mm, 3.00 mm, 4.00 mm, 5.00 mm, or any thickness between 0.001 mm to 5.00 mm.

Figures 3A, 3B:
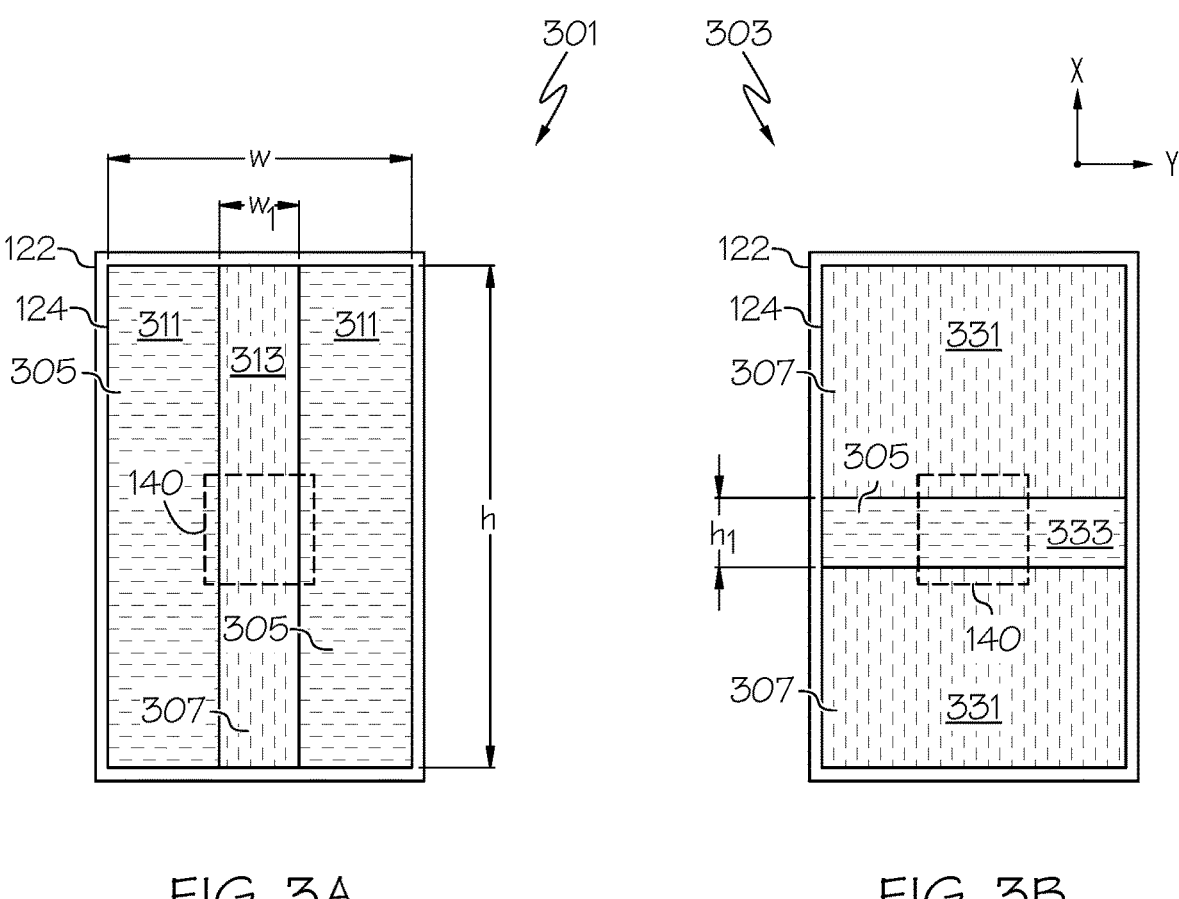
FIG. 3A schematically depicts a first example heat spreaders having side-center-side single-layer graphite layer configurations, according to one or more embodiments described and illustrated herein.
FIG. 3B schematically depicts a second example heat spreaders having side-center-side single-layer graphite layer configurations, according to one or more embodiments described and illustrated herein.

In embodiments, the heat spreaders 121 may include the single-layer graphite layer 124 encased in the metal layer 122. The single-layer graphite layer 124 may have a width (w) and a height (h). As illustrated in FIG. 3A, in the graphite configuration 301, a left-side graphite piece 311 connects a center graphite piece 313 at the left edge of the center graphite piece 313 and a right-side graphite piece 311 connects the center graphite piece 313 at the right edge of the center graphite piece 313. The center graphite piece 313 may have a width $(w_1)$ that is smaller than the width (h) of the single-layer graphite layer 124. The center graphite piece 313 and the two side graphite pieces 311 may have the same height of h as the height of the single-layer graphite layer 124. As illustrated in FIG. 3B, in the graphite configuration 303, a top side graphite piece 331 may connect a center graphite piece 333 at the top edge of the center graphite piece 333 and a bottom side graphite piece 331 may connect the center graphite piece 333 at the bottom edge of the center graphite piece 313. The center graphite piece 333 may have a height $(h_1)$ smaller than the height (h) of the single-layer graphite layer 124. The center graphite piece 333 and the side graphite pieces 331 may have the same width (w) as the single-layer graphite layer. The power electronics device 140 may contact with the center portion area of the single-layer graphite layer 124. The contact area may include partial center graphite pieces 313 and 333 and/or partial side graphite pieces 311 and 331.

The single-layer graphite layer 124 is depicted in the embodiments of FIGS. 3A and 3B are provided to encourage heat spreading both across the heat spreader 121 as well as toward the cooling device 110. It should be appreciated that the crystalline structure of graphite provides the graphite with high thermal conductivity, making it useful to conduct heat flux toward the cooling device 110. However, graphite does not have an isothermal profile. Rather, graphite has an anisothermal profile with high conductivity along two axes and low thermal conductivity in a third axis. To account for the anisothermal profile of graphite, each graphite piece 311 or 313 has a high thermal conductivity across two axes that differs from the two axes of another graphite piece 311 or 311 to provide a balanced thermal conductivity along each of the three axes of the single-layer graphite layer. In embodiments, the single-layer graphite layer 124 may include three or more adjacent graphite pieces 311 or 311 having high thermal conductivity along a thickness direction (i.e. z-axis as in FIGS. 1 and 2). At least one of the graphite pieces, such as graphite piece 311 has low thermal conductivity along a first axis, such as the x-axis, and the high thermal conductivity along a second axis, such as the y-axis. The first axis, such as the x-axis, and the second axis, such as the y-axis may be perpendicular to the thickness direction. At least one of the graphite pieces, such as the graphite piece 313, has the high thermal conductivity along the first axis, such as the x-axis, and the low thermal conductivity along the second axis, such as the y-axis.

Figures 3C, 3D:
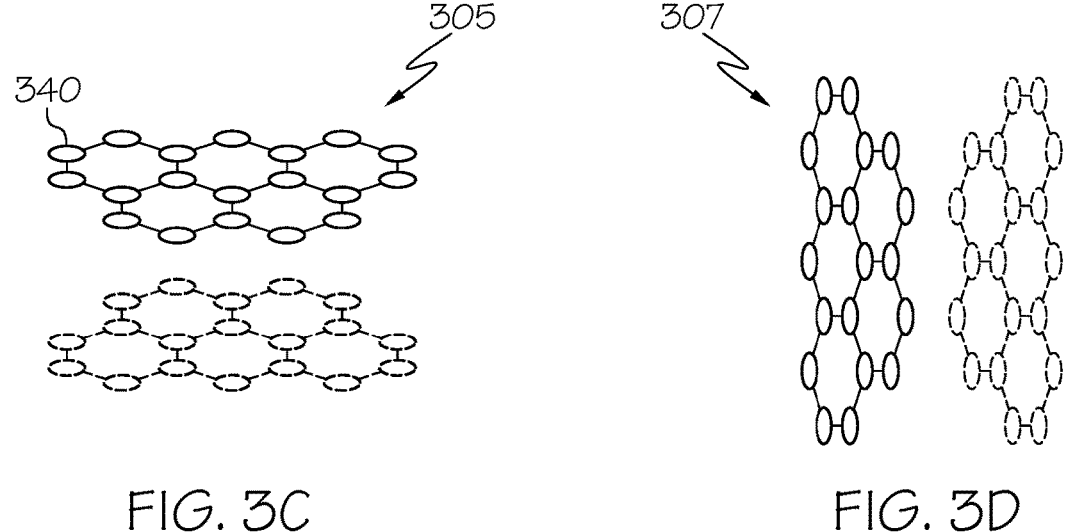
FIG. 3C schematically depicts one crystalline structure of the graphite piece, according to one or more embodiments described and illustrated herein.
FIG. 3D schematically depicts another crystalline structure of the graphite piece, according to one or more embodiments described and illustrated herein.

As a non-limiting example, as shown in FIGS. 3C and 3D, the crystalline structure 305 of the graphite piece 311 and the crystalline structure 307 of the graphite piece 313 are depicted. Specifically, the graphite piece 311 has high thermal conductivity along the x-axis and the z-axis (i.e., the thickness direction, as in FIGS. 1 and 2), and low thermal conductivity in the y-axis. As described herein, it should be appreciated that reference to a low thermal conductivity provided reduced heat spread capabilities as compared to high thermal conductivity. Accordingly, heat spreads a limited distance along an axis having a low thermal conductivity as compared to heat that spreads along a different axis having a high thermal conductivity. The crystalline structure 307 of the graphite piece 313 is rotated 90 degrees about the z-axis (i.e., the thickness direction) relative to the crystalline structure 305 of the graphite piece 311 such that the y-axis of the graphite piece 311 corresponds to the x-axis of the graphite piece 313.

As illustrated in FIGS. 3A and 3B, in the two side-center-side graphite configures, namely the configuration 301 and the configuration 303, the single-layer graphite layer 124 may include a rectangular center graphite piece 313 or 333 and two rectangular side graphite pieces 311 or 331 contact with the center graphite piece 313 or 333 on two parallel edges of the center graphite piece 313 or 333. In the graphite configuration 301, the center graphite piece 313 has a crystalline structure 307 with a high thermal conductivity along the x-axis, where carbon atoms 340 form a hexagonal lattice along the x-axis, and a low thermal conductivity along the y-axis, where the carbon layers of hexagonal lattice are bonded through Van der Waals forces along the y-axis. The side graphite pieces 311 has a crystalline structure 305 having the carbon layers of hexagonal lattice bonded along the y-axis with a high thermal conductivity and hexagonal-lattice structured carbon atoms 340 bonded along the x-axis with a low thermal conductivity. In the graphite configuration 303, the center graphite piece 333 has a crystalline structure 305 with a high thermal conductivity along the y-axis and a low thermal conductivity along the x-axis. The side graphite pieces 331 has a crystalline structure 307 with a high thermal conductivity along the x-axis and a low thermal conductivity along the y-axis. Accordingly, the heat spreading capabilities of the center graphite pieces 313 and 333 complement the heat spreading capabilities of the side graphite pieces 311 and 331 to allow improved heat spreading capabilities along the x-axis and the y-axis, rather than being disproportionate to one another when only a single graphite layer is utilized within an heat spreader 121. This achieves a higher heat flux and a much lower temperature profile for the power electronics device 140 as compared to embodiments in which only one graphite piece is used.

Figure 3E:
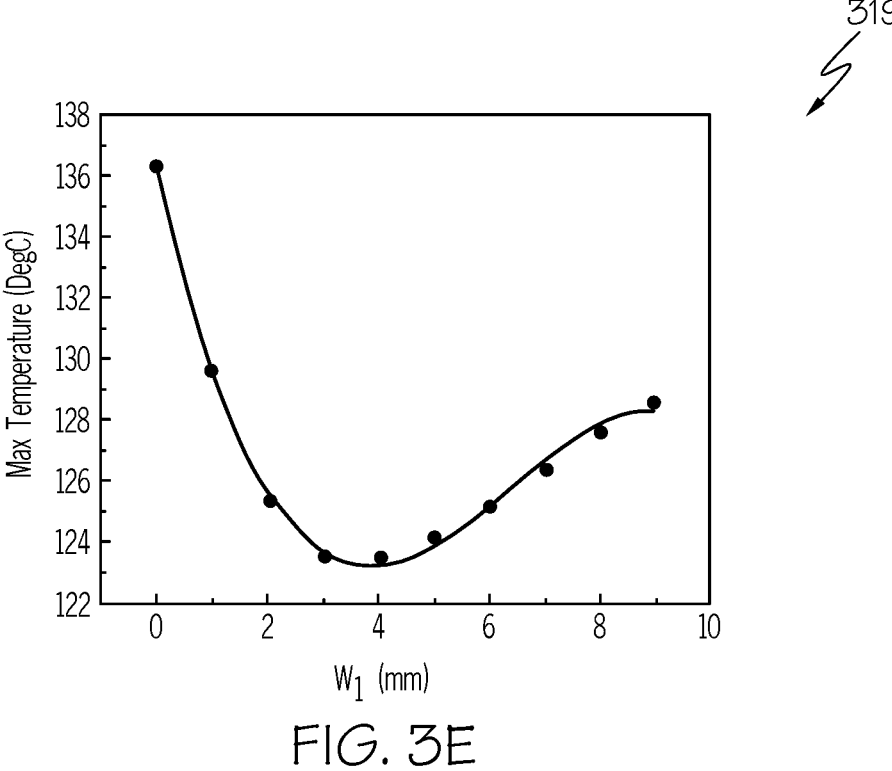
FIG. 3E schematically depicts the influence of the width of the center graphite piece of graphite configuration as in FIG. 3A, according to one or more embodiments described and illustrated herein.

In some embodiments, as illustrated in FIG. 3E, the width ($w_1$) of the center graphite piece 313 of graphite configuration 301 may be different than the width of the side graphite pieces 311. As illustrated in plotting 319, the maximum temperature of the heat spreader 121 may be a function of the width ($w_1$) of the center graphite piece 313. For example, the lowest maximum temperature of the heat spreader 121 may be 123.47° C., which may be achieved with the width ($w_1$) of the center graphite piece 313 around 4.0 mm with the width (w) of the single-layer graphite layer 124 around 25.0 mm. In embodiments, the width ($w_1$) of the center graphite piece 313 along the y-axis may be less than or equal to 1%, 2.5%, 5%, 7.5%, 10%, 12.5%, 15%, 17.5%, 20%, 22.5%, 25%, 27.5%, 30%, 35%, 40%, 45%, 50%, or any number between 1% and 50% of the width (w) of the single-layer graphite layer 124 along the y axis. In embodiments, the width ($w_1$) of the center graphite piece 313 along the y-axis may be greater than or equal to 1%, 2.5%, 5%, 7.5%, 10%, 12.5%, 15%, 17.5%, 20%, 22.5%, 25%, 27.5%, 30%, 35%, 40%, 45%, 50%, or any number between 1% and 50% of the width (w) of the single-layer graphite layer 124 along the y axis. In embodiments, the width ($w_1$) of the center graphite piece 313 along the y-axis may be between 1% and 50%, 5% and 45%, 10% and 40%, 15% and 35%, 20% and 30%, or any range from 1% and 50% of the width (w) of the single-layer graphite layer 124 along the y axis.

Figure 3F:
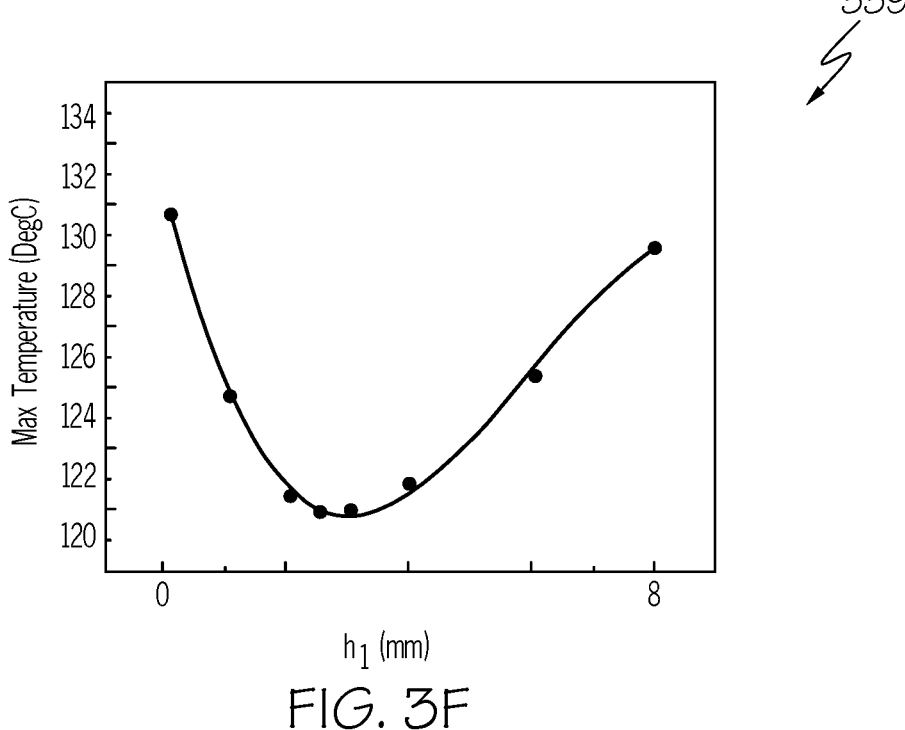
FIG. 3F schematically depicts the influence of the height of the center graphite piece of graphite configuration as in FIG. 3B, according to one or more embodiments described and illustrated herein.

In some embodiments, as illustrated in FIG. 3F, the height ($h_1$) of the center graphite piece 333 of graphite configuration 303 may be different than the height of the side graphite pieces 331. As illustrated in plotting 339, the maximum temperature of the heat spreader 121 may be a function of the height ($h_1$) of the center graphite piece 333. For example, the lowest maximum temperature of the heat spreader 121 may be 120.9° C., which may be achieved with the height ($h_1$) of the center graphite piece 333 around 3.0 mm with the height (h) of the single-layer graphite layer 124 around 40.0 mm. In embodiments, the height ($h_1$) of the center graphite piece 333 along the x-axis may be less than or equal to 1%, 2.5%, 5%, 7.5%, 10%, 12.5%, 15%, 17.5%, 20%, 22.5%, 25%, 27.5%, 30%, 35%, 40%, 45%, 50%, or any number between 1% and 50% of the height (h) of the single-layer graphite layer 124 along the x-axis. In embodiments, the height ($h_1$) of the center graphite piece 333 along the x-axis is greater than or equal to 1%, 2.5%, 5%, 7.5%, 10%, 12.5%, 15%, 17.5%, 20%, 22.5%, 25%, 27.5%, 30%, 35%, 40%, 45%, 50%, or any number between 1% and 50% of the height (h) of the single-layer graphite layer 124 along the x-axis. In embodiments, the height ($h_1$) of the center graphite piece 313 along the x-axis are between 1% and 50%, 5% and 45%, 10% and 40%, 15% and 35%, 20% and 30%, or any range from 1% and 50% of the height (h) of the single-layer graphite layer 124 along the x-axis.

Although not shown, it should be appreciated that the heat spreader assemblies 100 may include more than one single-layer graphite layer 124. For example, the heat spreader assemblies 100 may include three, four, or more than four single-layer graphite layer 124 positioned in any suitable arrangement such as, for example, one or more lower graphite layers and one or more upper graphite layers provided on the lower graphite layers and rotated 90 degrees relative to the one or more lower graphite layers such that the crystalline structure of the lower graphite layers differs from the upper graphite layers. As another non-limiting example, the graphite layers may alternate such that graphite layers having a crystalline structure arranged in a first orientation are interposed between graphite layers having a crystalline structure arranged in a second orientation different from the first orientation, i.e., 90 degrees offset.

Referring again to FIG. 1, an exploded view of an electronic-cell assembly 100 is depicted including the heat spreader 121 and the power electronics device 140. FIG. 1 depicts the power electronics device 140 and a bonding layer 143 with respect to the recess 127 of the heat spreader 121. The bonding layer 143 may be a solder layer, for example. As another example, the bonding layer 143 may be a transient liquid phase bonding layer 143. The power electronics device 140 includes a plurality of large electrodes 141 and a plurality of small electrodes 142 on a top surface of the power electronics device 140. The large electrodes 141 may be power electrodes, while the small electrodes 142 may be signal electrodes. It is noted that, although not visible in FIG. 1, the power electronics device 140 further includes one or more electrodes on a bottom surface of the power electronics device 140. The one or more electrodes on the bottom surface of the power electronics device 140 are electrically connected to the metal layer 122 by the placement of the power electronics device 140 into the recess 127. Thus, an electrical connection to the bottom electrodes of the power electronics device 140 may be made by way of the metal layer 122.

Referring now to FIGS. 4A-4F, six example heat spreaders 121 including six types of radial graphite configurations 401, 403, 405, 407, 409, and 411 of the single-layer graphite layer 124 are depicted. The single-layer graphite layer 124 is encased in the metal layer 122. The single-layer graphite layer 124 of the six radial graphite configurations includes three or four graphite pieces, with one or two graphite pieces having a crystalline structure 305 (as in FIG. 3) with high thermal conductivity along the y-axis and low thermal conductivity along the x-axis, and one or two graphite pieces having a crystalline structure 307 (as in FIG. 3) with high thermal conductivity along the x-axis and low thermal conductivity along the y-axis. The three or four graphite pieces may have a high thermal conductivity along the thickness direction (i.e., z-axis as in FIGS. 1 and 2). The graphite pieces of the single-layer graphite layer 124 may have rectangular shapes, square shapes, trapezoid shapes, triangular shapes, bow-tie shapes, U shapes, V shapes, or a combination thereof. One or more of the graphite pieces may engage with one or more of the other graphite pieces. At least partial of the engaged edges may be engaged at a center portion of the heat spreader 121, a center portion of the power device recess 127, or a center portion of the single-layer graphite layer 124. The heat distribution of the heat spreaders 121 in the radial graphite configurations 401, 403, 405, 407, 409, and 411 of the single-layer graphite layer 124 are substantially equal along the x-axis and the y-axis.

Figure 4C:
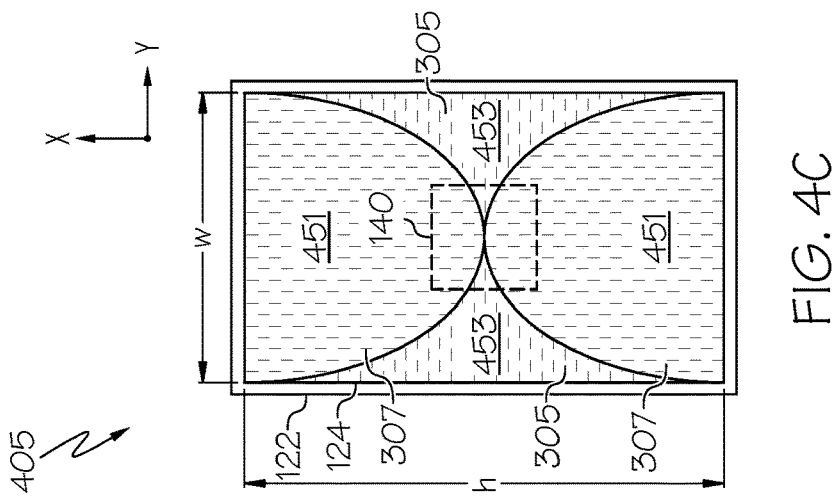
FIG. 4C schematically depicts a third example heat spreaders having radial graphite configurations, according to one or more embodiments described and illustrated herein.
Figure 4B:
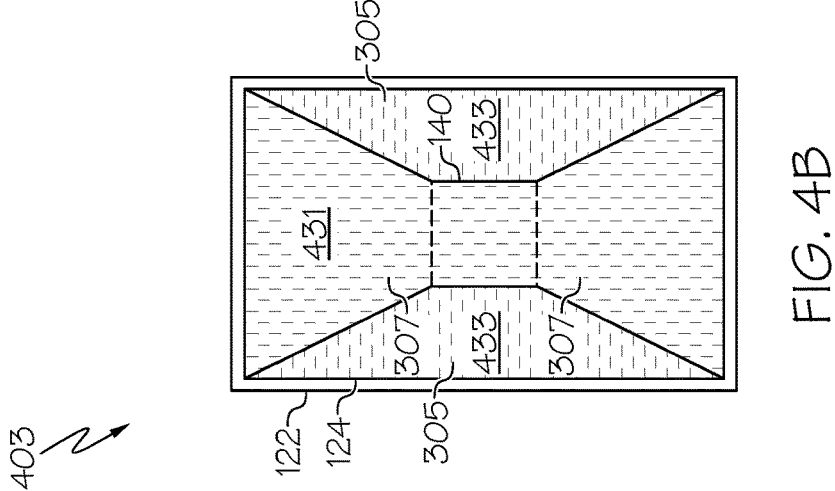
FIG. 4B schematically depicts a second example heat spreaders having radial graphite configurations, according to one or more embodiments described and illustrated herein.
Figure 4B:
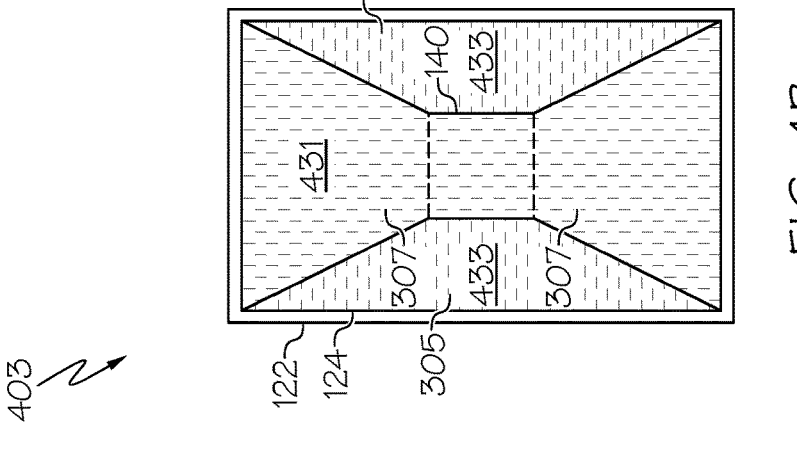
Figure 4A:
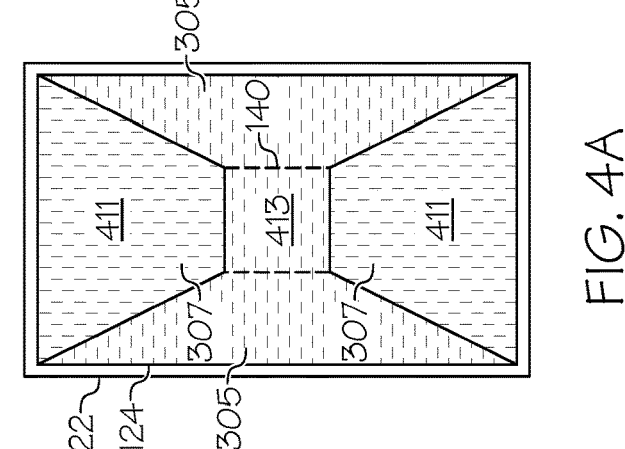
FIG. 4A schematically depicts a first example heat spreaders having radial graphite configurations, according to one or more embodiments described and illustrated herein.
Figure 4A:

As illustrated in FIG. 4A, the radial graphite configuration 401 of the single-layer graphite layer 124 has a bow-tie shape graphite piece 413 at the left, center, and right portions of the single-layer graphite layer 124 and two trapezoid shape graphite pieces 411 on the top and bottom portions of the single-layer graphite layer 124. The graphite piece 413 may have a crystalline structure 305. The graphite piece 411 may have a crystalline structure 307. The bow-tie shape of graphite piece 413 may include a narrow portion at the center of the bow-tie shape. The narrow portion of the bow-tie shape has the same shape and size as the power electronics device 140. The two trapezoid shape graphite pieces 411 may be engaged with the narrow portion of the bow-tie shape of the graphite piece 413 at the top and bottom edge of the narrow portion.

As illustrated in FIG. 4B, the radial graphite configuration 403 of the single-layer graphite layer 124 has a bow-tie shape graphite piece 431 at the top, center, and bottom portions of the single-layer graphite layer 124 and two trapezoid shape graphite pieces 433 on the left and right portions of the single-layer graphite layer 124. The graphite piece 431 may have a crystalline structure 307. The graphite pieces 433 may have a crystalline structure 305. The bow-tie shape of graphite piece 431 may include a narrow portion at the center of the bow-tie shape. The narrow portion of the bow-tie shape has the same shape and size as the power electronics device 140. The two trapezoid-shaped graphite pieces 433 may be engaged with the narrow portion of the bow-tie shape of the graphite piece 413 at the left and right edge of the narrow portion.

As illustrated in FIG. 4C, the radial graphite configuration 405 of the single-layer graphite layer 124 has two U shape graphite pieces 451 at the top and bottom portions of the single-layer graphite layer 124 and two V shape graphite pieces 453 on the left and right portions of the single-layer graphite layer 124. The U shape may be a semi-oval shape. The V-shape may be a complemental shape of the semi-oval shape, such as a bounded area having two semi-parabolas and a line. The graphite pieces 451 may have a crystalline structure 307. The graphite pieces 453 may have a crystalline structure 305. The U-shaped graphite pieces 451 and the V-shaped graphite pieces 453 may meet at the center of the single-layer graphite layer 124.

Figure 4F:
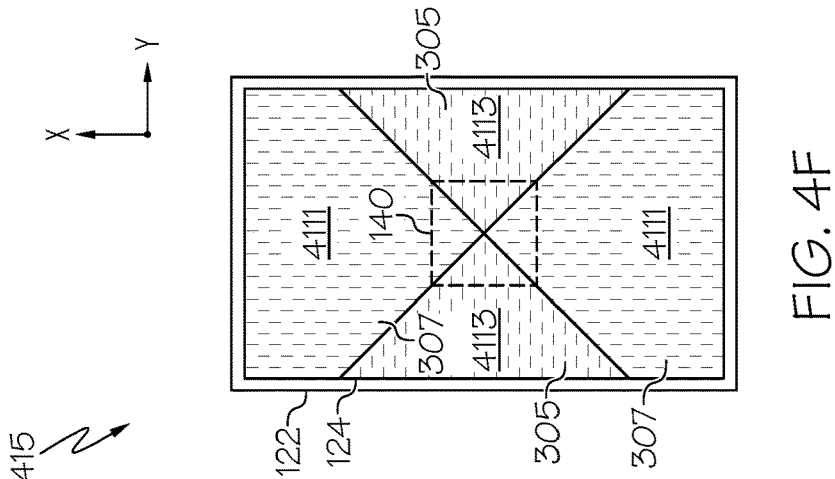
FIG. 4F schematically depicts a sixth example heat spreaders having radial graphite configurations, according to one or more embodiments described and illustrated herein.
Figure 4E:
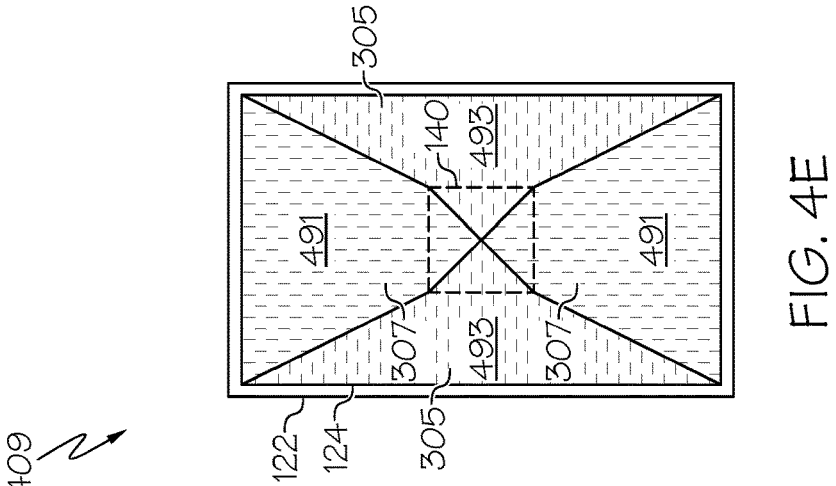
FIG. 4E schematically depicts a fifth example heat spreaders having radial graphite configurations, according to one or more embodiments described and illustrated herein.
Figure 4D:
FIG. 4D schematically depicts a fourth example heat spreaders having radial graphite configurations, according to one or more embodiments described and illustrated herein.
Figure 4D:
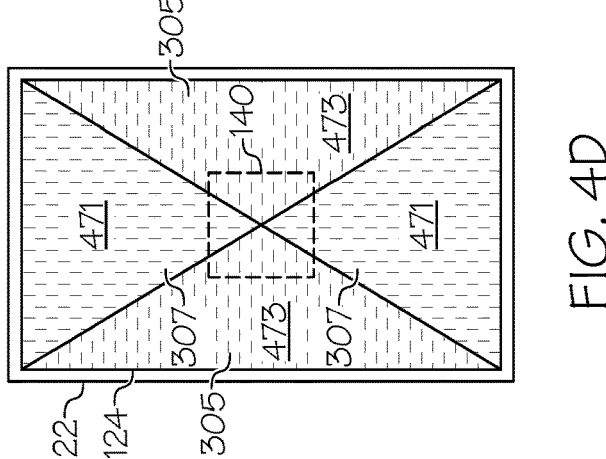

As illustrated in FIG. 4D, the radial graphite configuration 407 of the single-layer graphite layer 124 has two triangular shape graphite pieces 471 at the top and bottom portions of the single-layer graphite layer 124 and two triangular shape graphite pieces 473 on the left and right portions of the single-layer graphite layer 124. The graphite pieces 471 may have a crystalline structure 307. The graphite pieces 473 may have a crystalline structure 305. The triangular shape graphite pieces 471 and the triangular shape graphite pieces 473 may meet at the center of the single-layer graphite layer 124.

As illustrated in FIG. 4E, the radial graphite configuration 409 of the single-layer graphite layer 124 has two triangular shape graphite pieces 491 with a compressed vertex at the top and bottom portions of the single-layer graphite layer 124 and two triangular shape graphite pieces 493 with a stretched vertex on the left and right portions of the single-layer graphite layer 124. The graphite pieces 491 may have a crystalline structure 307. The graphite pieces 493 may have a crystalline structure 305. The compressed vertex of the triangular shape graphite pieces 491 and the stretched vertex of the triangular shape graphite pieces 493 may meet at the center of the single-layer graphite layer 124.

As illustrated in FIG. 4F, the radial graphite configuration 415 of the single-layer graphite layer 124 has two trapezoid shape graphite pieces 4111 at the top and bottom portions of the single-layer graphite layer 124 and two triangular shape graphite pieces 4113 on the left and right portions of the single-layer graphite layer 124. The trapezoid shape of the graphite pieces 4111 is a combination of a rectangular shape and a triangular shape. The graphite piece 4111 may have a crystalline structure 307. The graphite pieces 4113 may have a crystalline structure 305. A vertex of each trapezoid shape graphite pieces 4111 and the triangular shape graphite pieces 4113 may meet at the center of the single-layer graphite layer 124.

It should now be understood that embodiments of the present disclosure are directed to power electronics assemblies having a circuit board assembly coupled to an electronic-cell assembly that includes a cold plate containing an heat spreader. A power electronics device may be embedded within the heat spreader and/or within the circuit board assembly. The heat spreader may include a single-layer graphite layer. The single-layer graphite layer may include three or more graphite pieces with different direction of the high thermal conductivity. Such power electronics assemblies are compact, and provide increased thermal conductivity while maintaining the ability to electrically insulate heat spreaders, thereby improving heat flux from the heat spreader to the cold plate, thereby increasing heat spreading and cooling performance of the circuit board assembly relative to conventional packages.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

It will be apparent to those skilled in the art that various modifications and variations can be made to the embodiments described herein without departing from the scope of the claimed subject matter. Thus, it is intended that the specification cover the modifications and variations of the various embodiments described herein provided such modifications and variations come within the scope of the appended claims and their equivalents.

What is claimed is:

1. A heat spreader comprising:
a metal layer and a single-layer graphite layer, wherein:
the metal layer encases the single-layer graphite layer;
the single-layer graphite layer comprises three or more adjacent graphite pieces comprising a center graphite piece having a first height and a first width and two side graphite pieces each having a second height and a second width, the two side graphite pieces contacted with the center graphite piece on two parallel edges of the first height or the first width of the center graphite piece; and
the center graphite piece has low thermal conductivity along a first axis and the high thermal conductivity along a second axis, and the side graphite piece has low thermal conductivity along the second axis and the high thermal conductivity along the first axis, wherein the first axis and the second axis are perpendicular to the thickness direction, and the first height is different than the first width, and the second height is different than the second width.

2. The heat spreader of claim 1, wherein the center graphite piece has same lengths with the side graphite pieces along the first axis, and has different lengths compared with the side graphite pieces along the second axis.

3. The heat spreader of claim 2, wherein the lengths of the center graphite piece along the second axis are more than or equal to 1% and less than or equal to 50% of the lengths of the single-layer graphite layer along the second axis.

4. The heat spreader of claim 3, wherein the lengths along the second axis of the center graphite piece are more than or equal to 5% and less than or equal to 20% of the lengths of the single-layer graphite layer along the second axis.

5. The heat spreader of claim 1, wherein the center graphite piece has same lengths along the second axis with the side graphite pieces, and has different lengths compared with the side graphite pieces along the first axis.

6. The heat spreader of claim 5, wherein the lengths of the center graphite piece along the first axis are more than or equal to 1% and less than or equal to 50% of the lengths of the single-layer graphite layer along the first axis.

7. The heat spreader of claim 6, wherein the lengths of the center graphite piece along the first axis are more than or equal to 5% and less than or equal to 20% of the lengths of the single-layer graphite layer along the first axis.

8. The heat spreader of claim 1, wherein a heat distribution of the heat spreader is substantially equal along the first axis and the second axis.

9. The heat spreader of claim 1, wherein the graphite pieces have rectangular shapes, square shapes, trapezoid shapes, triangular shapes, bow-tie shapes, U shapes, V shapes, or a combination thereof.

10. The heat spreader of claim 9, wherein edges of the graphite pieces are partially engaged at a center portion of the heat spreader or a center portion of the single-piece graphite.

11. The heat spreader of claim 1, wherein the heat spreader has a rectangular shape.

12. An electronic-cell assembly, comprising:
a heat spreader comprising a metal layer and a single-layer graphite layer, the metal layer encasing the single-layer graphite layer and defining a power device recess in an outer surface of the metal layer, and the single-layer graphite layer comprising three or more adjacent graphite pieces comprising a center graphite piece having a first height and a first width and two side graphite pieces having a second height and a second width, the two side graphite pieces contacted with the center graphite piece on two parallel edges of the first height or the first width of the center graphite piece;
a power electronics device disposed within the power device recess of the outer surface of the heat spreader, and
wherein:
the center graphite piece has low thermal conductivity along a first axis and the high thermal conductivity along a second axis, and the side graphite piece has low thermal conductivity along the second axis and the high thermal conductivity along the first axis, wherein the first axis and the second axis are perpendicular to the thickness direction, and the first height is different than the first width, and the second height is different than the second width.

13. The electronic-cell assembly of claim 12, wherein the heat spreader has a rectangular shape and the power device recess is at a center portion, an upper portion, or a lower portion of the heat spreader.

14. The electronic-cell assembly of claim 12, wherein the graphite pieces have rectangular shapes, square shapes, trapezoid shapes, triangular shapes, bow-tie shapes, U shapes, V shapes, or a combination thereof;
edges of the graphite pieces are partially engaged at a center portion of the heat spreader, a center portion of the power device recess, or a center portion of the single-piece graphite; and
a heat distribution of the heat spreader is substantially equal along the first axis and the second axis.

15. The electronic-cell assembly of claim 12, wherein the center graphite piece has same lengths along the first axis with the side graphite pieces, and has different lengths compared with the side graphite pieces along the second axis.

16. The electronic-cell assembly of claim 15, wherein the lengths along the second axis of the center graphite piece are more than or equal to 1% and less than or equal to 50% of the lengths of the single-layer graphite layer along the second axis.

17. The electronic-cell assembly of claim 12, wherein the center graphite piece has same lengths with the side graphite pieces along the second axis, and has different lengths compared with the side graphite pieces along the first axis.

18. The electronic-cell assembly of claim 17, wherein the lengths of the center graphite piece along the first axis are more than or equal to 1% and less than or equal to 50% of the lengths of the single-layer graphite layer along the first axis.

* * * * *